United States Patent [19]

Mathes

[11] 4,415,819

[45] Nov. 15, 1983

[54] DYNAMIC MOS-LOGIC IN INTERLACE-TECHNIQUES

[75] Inventor: Egon Mathes, Elmshorn, Fed. Rep. of Germany

[73] Assignee: U.S. Philips Corporation, New York, N.Y.

[21] Appl. No.: 223,198

[22] Filed: Jan. 8, 1981

[30] Foreign Application Priority Data

Jan. 16, 1980 [DE] Fed. Rep. of Germany ....... 3001389

[51] Int. Cl.³ ................ H03K 19/017; H03K 19/096; H03K 19/20
[52] U.S. Cl. .................................. 307/481; 307/453; 307/581; 307/450
[58] Field of Search .............. 307/450, 452, 453, 481, 307/468, 572, 574, 581, 582

[56] References Cited

U.S. PATENT DOCUMENTS

| | | | |
|---|---|---|---|
| 3,573,487 | 4/1971 | Polkinghorn | 307/453 |
| 3,852,625 | 12/1974 | Kubo | 307/481 |
| 3,982,138 | 9/1976 | Luisi et al. | 307/450 X |
| 4,107,548 | 8/1978 | Sakaba et al. | 307/453 X |
| 4,123,669 | 10/1978 | Devine et al. | 307/450 |

Primary Examiner—Larry N. Anagnos
Assistant Examiner—David R. Hudspeth
Attorney, Agent, or Firm—James J. Cannon, Jr.

[57] ABSTRACT

Some known logic MOS circuits operated too slowly because too many "branches" were connected to a node of the circuit to be charged or discharged for the information transfer. The invention relates to a circuit arrangement with isolated branches, so that a faster clock signal can be used, which results in faster operation of the circuit.

1 Claim, 3 Drawing Figures

DYNAMIC MOS-LOGIC IN INTERLACE-TECHNIQUES

BACKGROUND OF THE INVENTION

1. Field of the Invention

The invention relates to an integrated digital circuit arrangement with MOS field-effect transistors, which arrangement comprises a combinatorial circuit for applying a logic operation to a plurality of input signals, which combinatorial circuit comprises a plurality of "branches" arranged as NAND-NAND logic gates, there being provided means for applying said input signals as well as an output, which is coupled to a first node of the arrangement, whose potential at a specific instant is representative of the result of the logic operation and depends on whether the capacitance of the first node is charged or not.

2. Description of the Prior Art

Such a circuit arrangement is known and is employed in the integrated Philips circuits SAB 3022B, SAB 3032D. These devices employ an N-MOS circuit in dynamic two-phase technique, which operates as follows:

A buffer circuit, which is clocked by non-overlapping clock signals, transfers the logic information from a node of the combinatorial circuit to an output with a delay of one clock period. For a reliable transfer of information it is important that this node is already at a precharge potential when it receives said information. In other words, the node should be precharged at the instant that the information arrives there. If a logic "1" is to be transferred via the node, this node is isolated after being pre-charged until the potential (which in this case remains high) is sampled for further information transfer. If a logic "0" is to be transferred the node is discharged to a low potential via one or more branches of the combinatorial circuit, after which this potential is sampled.

It is found that when such a circuit arrangement is used the frequency of the clock signals is limited because pre-charging and especially discharging of the node takes too much time. This is because numerous branches of the combinatorial circuit are connected to the node, so that the capacitance of this node is substantial, while for example under specific circumstances discharging via only one branch should be possible. It should be borne in mind that one such branch when conducting still represents a significant resistance, which has an adverse effect on the discharge time. Said resistance can only be reduced by use of larger transistors, which is not desirable in view of the required substrate area.

SUMMARY OF THE INVENTION

It is the object of the invention to provide a circuit arrangement of the type mentioned in the opening paragraph, which enables a higher information processing speed, which means that faster clock signals can be used.

According to the invention this is achieved by providing each branch in a circuit arrangement of the type mentioned in the opening paragraph with a pre-charging transistor, while for isolating the individual branches from each other there is provided a transistor arranged as a transfer gate for each branch, whose gate electrode is connected to the relevant branch, the source and drain electrodes of these transistors being included in series between a common reference point and the first node.

The advantage of the circuit arrangement in accordance with the invention is that instead of the customary clock frequencies of about 50 kHz it is now possible to employ clock frequencies of approximately 500 kHz, which means that the circuit operates ten times as fast.

BRIEF DESCRIPTION OF THE DRAWINGS

The invention will now be described in more detail with reference to the accompanying drawing, in which.

DESCRIPTION OF THE PREFERRED EMBODIMENT

Figures 1, 2A, 2B:
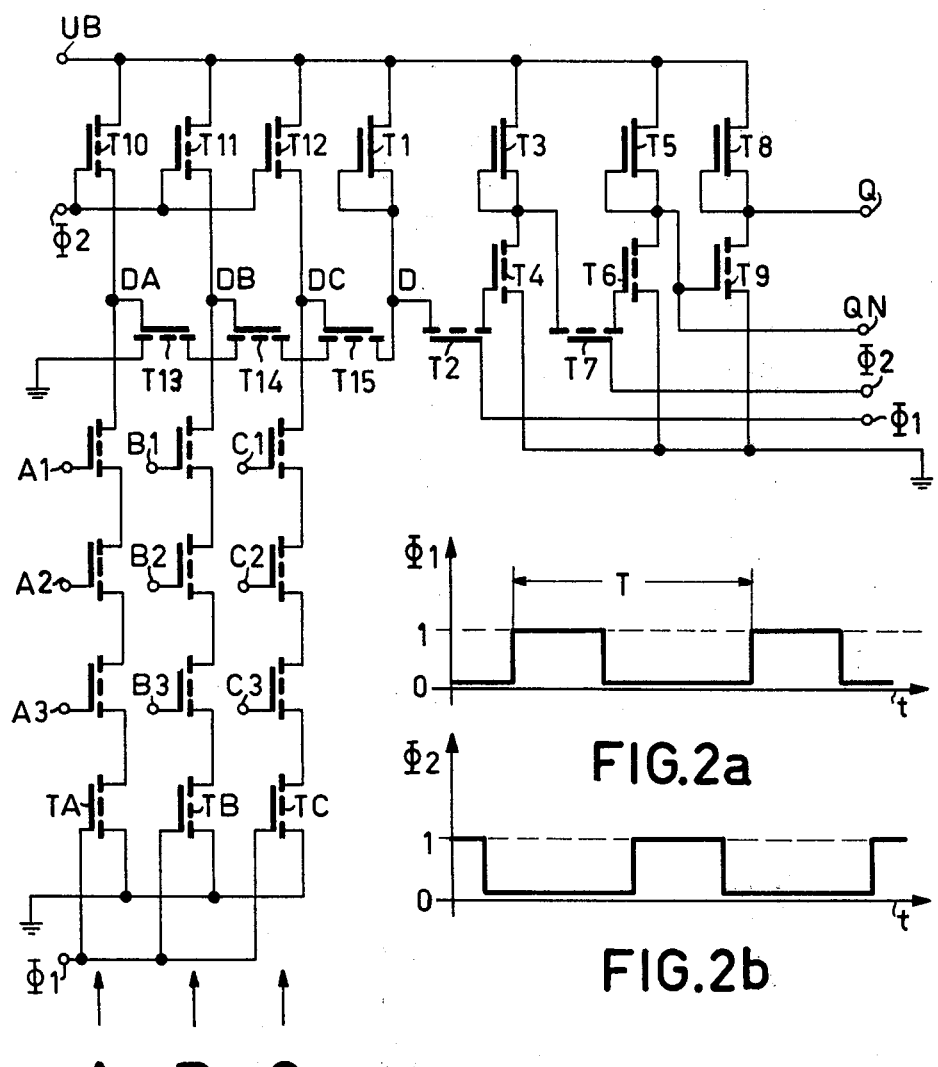
FIG. 1 shows an embodiment of the invention.
FIGS. 2a and 2b represent the clock signals required for a correct operation of the circuit arrangement of FIG. 1.

The circuit arrangement of FIG. 1 comprises enhancement-type insulated-gate field-effect transistors, such as the transistors $T_{13}$, $T_{14}$ and $T_{15}$, and similar transistors of the depletion type, such as the transistors $T_1$, $T_3$, $T_5$ and $T_8$.

The supply voltage is designated UB and is for example +5 V. There is a common reference potential, which is represented in the drawing by the customary ground symbol.

Two clock signals, shown in FIG. 2, control the circuit. These two clock signals are designated $\emptyset 1$ and $\emptyset 2$. The clock signals vary between the logic "0" level and the logic "1" level, the logic "1" level for example corresponding to a voltage of +4 V and the logic "0" level to a voltage of 0 V.

The circuit arrangement mainly comprises three sections: one section is the customary buffer circuit, comprising transistors $T_2$ to $T_9$. In the prior-art versions problems occurred at the first node D of the circuit, because for taking over information from the combinatorial circuit said node had to be pre-charged and, as the case may be, discharged rapidly, while in the same way as in the embodiment in accordance with the invention the clock signal $\emptyset 2$ was the pre-charging clock signal and the clock signal $\emptyset 1$ the sampling clock signal.

The second section is the combinatorial circuit, which in this case comprises 3 branches. The branches include the transistors Ta, Tb and TC, which are clocked by the clock signal $\emptyset 1$. The sticks further comprise transistors whose gate electrodes are connected to the input terminals A1, A2, A3, B1, B2, B3, C1, C2 and C3, via which the input information is applied. The result of the logic operation realized by the combinatorial circuit is available on the respective outputs Q and QN of the buffer circuit.

In order to enable a rapid pre-charging and discharging of the node D of the circuit arrangement and thus the use of a higher clock frequency, seven additional transistors are included in the combinatorial circuit of the embodiment of the invention shown in FIG. 1, which additional transistors constitute the third section of the circuit arrangement.

These additional transistors include the precharging transistors T10, T11 and T12, whose gate electrodes are connected to the clock line $\emptyset 2$, so that when $\emptyset 2$ is at logic "1" level, nodes DA, DB, DC of the circuit are charged, and further the transfer-gate transistors $T_{13}$, $T_{14}$ and $T_{15}$, which provide an isolation between the individual branches, transistor $T_1$ being arranged as a load transistor. If, for example, a logic "0" from stick A has to be transferred, node DA of the circuit arrangement should be discharged rapidly. If the branches A, B and C were all connected directly to node D of the circuit, not only node A but also the nodes DB and DC, would have to be discharged, which obviously takes time. The inclusion of transistors T1, T13, T14 and T15 enables the nodes DA, DB and DC to be discharged individually. This can be done much faster, because in this case only the capacitance of one node is to be discharged via the associated branch.

The operation of such an N-MOS circuit, using the so-called dynamic two-phase technique, is as follows:

A buffer circuit, which is clocked by clock signals $\emptyset 1$ and $\emptyset 2$, which do not overlap each other in time, transfers the potential of the node D (logic level "1" or "0") to the output Q or the inverted output QN via transistors T2 and T7 with a delay of one clock period T. The potential of the node D in the circuit arrangement in accordance with the invention is determined by the potentials of the nodes DA, DB and DC of the individual branches. Since the branches are isolated from each other, nodes DA, DB and DC are each charged separately via the associated pre-charging transistor during the time that $\emptyset 2$ is "high".

Depending on the information applied to the input terminals A1, A2, A3, B1, B2, B3, C1, C2, and C3 one or more of the branches A, B, and C can be turned on, so that during the time that $\emptyset 2$ is high and transistors Ta, TB, and TC conduct the charge of the node(s) associated with the conductive branch(es) is drained. The embodiment for the sticks A, B and C of the combinatorial circuit shown in the drawing is merely an example. It can be adapted to suit the function to be realized.

By discharging one or more of the nodes DA, DB or DC via the associated branch(es) the connected gate electrode of the relevant transistor(s), namely T13, T14 and T15 respectively, assumes the logic "0" level, so that the relevant transistor(s) T13, T14 and/or T15 is (are) turned off and transistor T1 can consequently charge the node D rapidly to logic "1" potential. Since transistor T2 conducts during the sampling phase, that is when the clock signal $\emptyset 1$ is at logic "1" level, the level on the node D of the arrangement also appears on the gate of the transistor T4, where it is also maintained if at the end of the sampling phase transistor T2 is turned off again.

The other transistors T3, T5, T6, T8, T9 and T7 are included in a circuit which is commonly used and known as a buffer circuit. Furthermore, it is to be noted that by the inclusion of the transistors T13, T14, T15 and the load transistor T1 in accordance with the invention the signal on the node D is inverted in comparison with logic circuits known so far, so that in this way a signal inversion is obtained.

What is claimed is:

1. An integrated digital circuit arrangement with MOS field-effect transistors, which arrangement comprises a combinatorial circuit for applying a logic operation to a plurality of input signals, which combinatorial circuit comprises a plurality of branches, there being provided means for applying said input signals as well as an output, which is coupled to a first node of the arrangement, whose potential at a specific instant is representative of the result of the logic operation and depends on whether the capacitance of the first node is charged or not, characterized in that:

each branch is provided with a pre-charging transistor while for isolating the individual branches from each other there is provided a transistor arranged as a transfer gate for each branch, whose gate-electrode is connected to the relevant branch, the source and drain electrodes of said transistors arranged as a transfer gate being included in series between a common reference point and the first node, wherein the charging time of said first node capacitance is essentially independent of the number of transistors in said transfer gate and said charging time occurs prior to said specific instant.

* * * * *